United States Patent [19]

Arleo

[11] Patent Number: 5,880,037
[45] Date of Patent: Mar. 9, 1999

[54] OXIDE ETCH PROCESS USING A MIXTURE OF A FLUORINE-SUBSTITUTED HYDROCARBON AND ACETYLENE THAT PROVIDES HIGH SELECTIVITY TO NITRIDE AND IS SUITABLE FOR USE ON SURFACES OF UNEVEN TOPOGRAPHY

[75] Inventor: Paul Arleo, San Francisco, Calif.

[73] Assignee: Applied Materials, Inc., Santa Clara, Calif.

[21] Appl. No.: 948,275

[22] Filed: Oct. 9, 1997

Related U.S. Application Data

[63] Continuation-in-part of Ser. No. 565,184, Nov. 28, 1995, abandoned, which is a continuation-in-part of Ser. No. 145,894, Oct. 29, 1993, abandoned, which is a continuation-in-part of Ser. No. 941,501, Sep. 8, 1992, Pat. No. 5,423,945.

[51] Int. Cl.$^6$ .................................................. H01L 21/302
[52] U.S. Cl. ........................... 438/740; 438/723; 438/724
[58] Field of Search ................................... 438/710, 723, 438/724, 740

[56] References Cited

U.S. PATENT DOCUMENTS

| | | |
|---|---|---|
| 4,324,611 | 4/1982 | Vogel et al. ........................... 156/643 |
| 4,350,578 | 9/1982 | Frieser et al. . |
| 4,675,073 | 6/1987 | Douglas . |
| 5,269,879 | 12/1993 | Rhoades et al. . |
| 5,286,344 | 2/1994 | Blalock et al. . |
| 5,296,095 | 3/1994 | Nabeshima et al. . |
| 5,423,945 | 6/1995 | Marks et al. . |
| 5,429,710 | 7/1995 | Akiba et al. . |
| 5,468,342 | 11/1995 | Nulty et al. . |
| 5,503,901 | 4/1996 | Sakai et al. . |

FOREIGN PATENT DOCUMENTS

| | | |
|---|---|---|
| 0 644 584 A1 | 3/1995 | European Pat. Off. . |
| 0 651 434 A2 | 5/1995 | European Pat. Off. . |
| 55-009464 | 1/1980 | Japan . |

OTHER PUBLICATIONS

"Nondestructive Characterization of RIE Induced Radiation Damage Using Surface Acoustic Waves,".
Gilboa et al.; 1985; abstract only; Plasma Synthesis and Etching of Elect. Mat. Symp.
"The Effect of Added Acetylene On The RF Discharge Chemistry of $C_2F_6$, A Mechanistic Model For Fluorocarbon Plasmas," Truesdale et al.; J. Appl. Phys. 51(5), May 1980; pp. 2909–2913.

*Primary Examiner*—Benjamin Utech
*Assistant Examiner*—George Goudreau
*Attorney, Agent, or Firm*—Limbach & Limbach

[57] ABSTRACT

A method of plasma etching oxide in the presence of nitride includes contacting the oxide with a mixture of gases including one or more flourine-substituted hydrocarbon etching gases and acetylene. The method exhibits high selectivity to nitride, including nitride on uneven surfaces.

9 Claims, 1 Drawing Sheet

OXIDE ETCH PROCESS USING A MIXTURE OF A FLUORINE-SUBSTITUTED HYDROCARBON AND ACETYLENE THAT PROVIDES HIGH SELECTIVITY TO NITRIDE AND IS SUITABLE FOR USE ON SURFACES OF UNEVEN TOPOGRAPHY

CROSS REFERENCE TO RELATED APPLICATIONS

This application is a continuation-in-part of and commonly-assigned U.S. patent application Ser. No. 08/565,184, filed Nov. 28, 1995, and now abandoned, which is a continuation-in-part of commonly-assigned U.S. patent application Ser. No. 08/145,894, filed Oct. 29, 1993, now abandoned, which is a continuation-in-part of commonly-assigned U.S. patent application Ser. No. 07/941,501, filed Sep. 8, 1992, now U.S. Pat. No. 5,423,945. Application Ser. No. 08/565,184, application Ser. No. 08/145,894 and U.S. Pat. No. 5,423,945 are hereby incorporated by reference in their entirety.

BACKGROUND OF THE INVENTION

1. Field of the Invention

The present invention relates to oxide etch processes and, in particular, to an oxide etch process that uses an etch chemistry based upon a mixture of a fluorine-substituted hydrocarbon, such as $C_4F_8$ or $C_2F_6$, and acetylene ($C_2H_2$). The etch process exhibits high selectivity to nitride and can be used on surfaces of uneven topography.

2. Description of the Related Art

A significant challenge in semiconductor fabrication is to etch silicon oxide in the presence of silicon nitride without also etching the nitride, i.e., while maintaining a high selectivity to the nitride. For example, in the case of an oxide layer located over a nitride layer, since both the oxide and nitride materials generally etch at the same rate in a typical fluorocarbon etch plasma, a process of providing additional selectivity to the nitride must be found.

When a fluorine-substituted hydrocarbon is used as an etchant, the fluorocarbon radicals react in the plasma to form a passivating coating of carbon-fluorine polymer over the materials being etched. However, this polymer is dissociated by oxide atoms formed during the etch of the exposed oxide portions. Thus, as the silicon oxide continues to etch, the exposed silicon nitride portions etch at a much slower rate due to the presence of the passivating coating. However, the passivating layer is also attacked by free fluorine atoms present in the plasma and, thus, the nitride also continues to be etched. As a result, a selectivity over about 8:1 of silicon oxide to silicon nitride is not achievable with such prior art etch processes due to the presence of free fluorine atoms in the plasma. Since state of the art devices having submicron dimensions require selectivity of over 10:1, and even greater than 30:1, an etch process for etching oxide in preference to nitride with a selectivity of over 10:1 is highly desirable.

Commonly-assigned U.S. Pat. No. 5,423,945 describes the provision of a scavenger for fluorine, such as a source of silicon or carbon, which, when used in combination with fluorine-substituted hydrocarbon etch gases, results in the formation of a carbon-rich polymer which does not dissociate over nitride surfaces. This result is apparently due to either the reduced free fluorine content in the plasma, or the reduced fluorine content in the polymer, or both. In any event, use of a scavenger for fluorine in combination with fluorine-substituted hydrocarbon etch gases results in an oxide etch having a selectivity to nitride of over 10:1, and as high as approaching infinity (i.e., no measurable nitride loss).

More recently, an additional problem has been discovered in the case where at least the nitride surfaces of the nitride/oxide structure being etched are not flat, as for example, the sidewalls of a slot or raised steps such as, for example, nitride-coated polysilicon lines.

This type of structure is illustrated in FIG. 1 wherein raised polysilicon lines 10 and 12, formed over a substrate 2, are coated with a conformal layer 20 of nitride, over which is formed an oxide layer 30 and a photoresist mask 40. When oxide layer 30 is etched, through mask opening 42 in photoresist mask 40, down to conformal nitride layer 20, nitride portions 22 on the sidewalls of raised polysilicon lines 10 and 12 are also at least partially etched, indicating that the above-described protective polymer is either not forming on the generally vertical surfaces (surfaces generally perpendicular to, or at least not planar with, the underlying substrate 2), or the protective polymer is being more readily attacked by the etchant gases on the non-planar surfaces than are the corresponding polymer portions formed on horizontal surfaces (surfaces generally planar to the underlying substrate 2) such as nitride portion 26 between raised polysilicon lines 10 and 12.

Commonly-assigned U.S. patent application Ser. No. 08/145,894 discloses that the addition of one or more hydrogen-containing gases, preferably one or more hydrofluorocarbon gases, to one or more fluorine-substituted hydrocarbon etch gases in contact with a scavenger for fluorine, in a plasma etch process for etching oxide in preference to nitride, results in a high selectivity to nitride which is preserved regardless of the topography of the nitride portions of the substrate surface. Preferably, one or more oxygen-bearing gases are also added to reduce the overall rate of polymer deposition on the etch chamber surfaces and on the surfaces to be etched.

Commonly-assigned U.S. patent application Ser. No. 08/565,184 discloses that the use of an etch gas mixture selected from $C_4F_8+H_2$, $C_4F_8+CH_3F$, $C_4F_8+CHF_3+H_2$ and $C_2F_6+C_2H_2$, at certain specified etch conditions, and in the presence of a fluorine scavenger, results in a process that is also highly selective to nitride regardless of the topography of the substrate surface.

SUMMARY OF THE INVENTION

It has now been found that a process in which oxide is etched with a mixture of gases that includes a fluorine-substituted hydrocarbon etching gas, e.g. $C_4F_8$ or $C_2F_6$, and acetylene ($C_2H_2$), without the need for a fluorine scavenger, also provides high selectivity to nitride and is suitable for use on surfaces of uneven topology.

A better understanding of the features and advantages of the present invention will be obtained by reference to the following detailed description and accompanying drawings which set forth illustrative embodiments in which the principles of the invention are utilized.

DETAILED DESCRIPTION OF THE INVENTION

The invention is directed to an improved oxide plasma etching process having a high selectivity to nitride which is suitable for use with uneven topographies. The process uses an etchant gas mixture that includes a fluorine-substituted hydrocarbon, such as $C_4F_8$ or $C_2F_6$, and acetylene ($C_2H_2$).

The amount of $C_2H_2$ mixed with the fluorine-substituted hydrocarbon etchant gas may range from as little as 20% volume percent (vol. %) to as high as 70% vol. % of the fluorine-substituted hydrocarbon etchant gases. Preferably, the amount of $C_2H_2$ added to the fluorine-substituted hydrocarbon etchant gas will range from about 30% vol. % to about 60% vol. % of the fluorine-substituted hydrocarbon etchant gas. Advantageous results in accordance with the concepts of the invention are obtained using a $C_2H_2$ source of less than semiconductor grade (where semiconductor grade=99.999% purity). The $C_2H_2$ source used in development work relating to the invention was 99.98% purity.

The amount of the fluorine-substituted hydrocarbon etchant gas, e.g., $C_4F_8$ or $C_2F_6$, flowed into an etch chamber of, for example, about 20 liters in volume, may range from about 10–15 sccm in the case of $C_4F_8$ and about 15–25 sccm in the case of $C_2F_6$. Those skilled in the art will appreciate that the flow rates are relative to the etch chamber volume and should be adjusted upwardly or downwardly, as the case may be, for larger or smaller etch chambers and in view of other process parameters, e.g. source power and bias power.

The temperature of the substrate being etched will be maintained within a range of from about 10°–110° C., and preferably will be maintained at from about 80°–100° C. Temperatures below about 10° C. are considered too low for practical operation of the etch process (since the substrate tends to heat up during the etch process), while temperatures in excess of 110° C. may damage other components present on the substrate, such as, for example, the photoresist mask. Those skilled in the art will appreciate that the temperature upper limit will be established by the photoresist utilized in the process.

The pressure in the etch chamber during the plasma etch process will range from about 8–40 milliTorr in the case of $C_4F_8$ etch mechanism and about 8–80 milliTorr in the case of the $C_2F_6$ etch mechanism.

Figure 2:
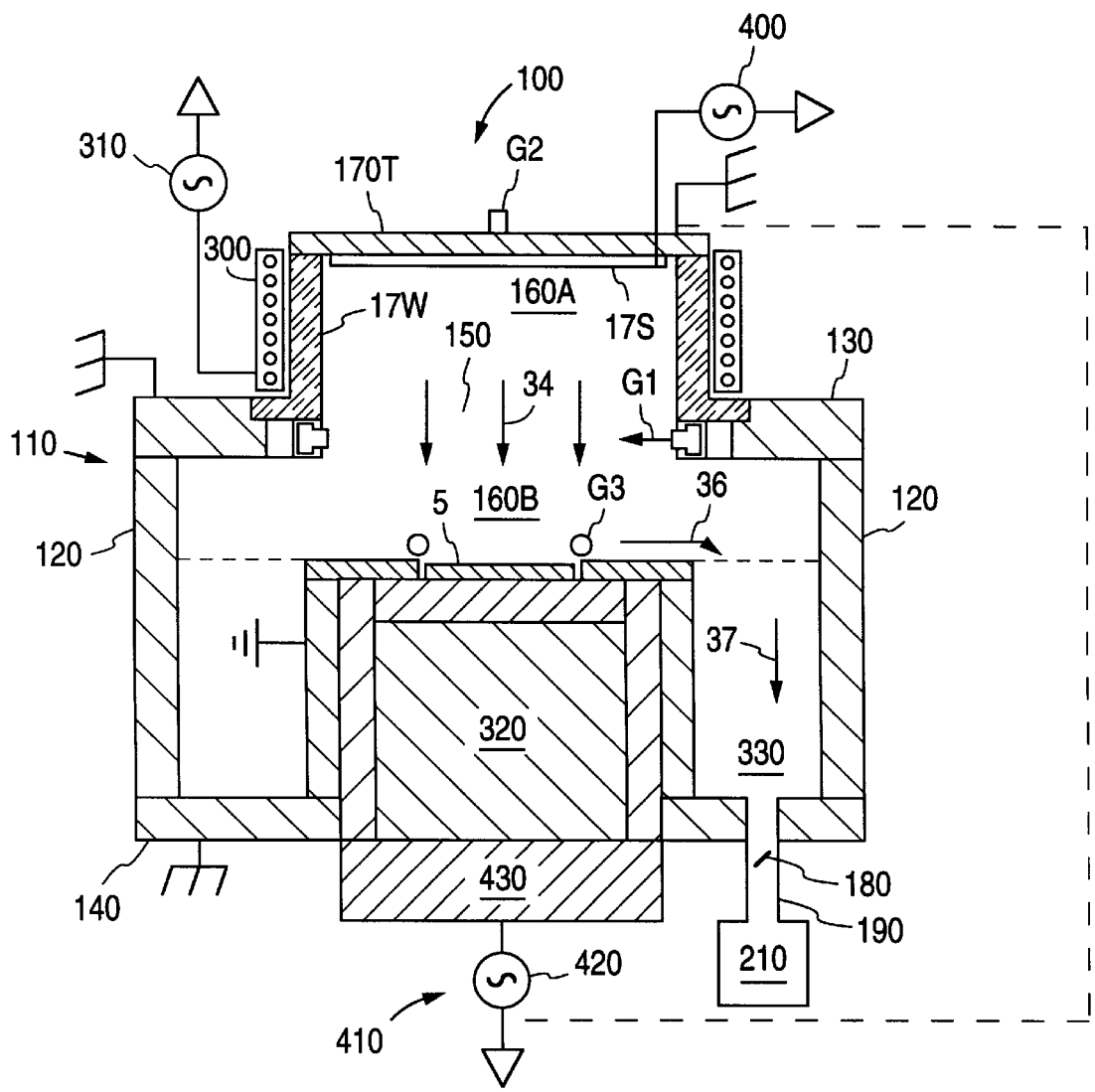
FIG. 2 is a cross-sectional view illustrating a preferred etch apparatus suitable for use with a process in accordance with the present invention.

FIG. 2 illustrates an etch apparatus suitable for use in the practice of the oxide plasma etch process of the present invention, wherein a reactor system 100 includes a vacuum chamber housing 110, formed of anodized aluminum or other suitable material, having sidewalls 120 and top and bottom walls 130 and 140, respectively. A top wall 130 has a central opening 150 between a lower chamber substrate processing section 160B defined between sidewalls 120–120 and an upper chamber plasma source section 160A defined by a dome comprising dome sidewalls 17W and a dome topwall 170T. The dome topwall 170T may be configured as an inverted single or double walled cup which is formed of a dielectric, such as quartz.

The evacuation of the interior of the chamber housing 110 (i.e. chamber sections 160A and 160B) is controlled by a throttle valve 180 in a vacuum line 190 which is inserted in the bottom wall 140 and connects to a vacuum pumping system 210 comprising one or more vacuum pumps.

Process gases can be supplied to the chamber housing 110 by three manifold injection sources, G1, G2, and G3 located, respectively, at the base of the source section 160A, at the dome topwall 170T, and peripherally about the substrate 5 to be etched. The overall gas flow is along path 34 from the chamber source section 160A toward the substrate 5, and along path 36 from the substrate 5 to an outlet manifold 330, and along path 37 from the outlet manifold 330 to the vacuum system 210.

RF energy is supplied to the dome adjacent dome sidewall 17W by a source comprising an antenna 300 of at least one turn or coil which is powered by an RF supply and matching network 310. The antenna 300 is tuned to resonance, or resonated using lumped elements, i.e., for example, capacitors, for efficient inductive coupling with the plasma source. A plasma is generated in the dome concentrated in the volume defined within the coil antenna 300. Active species, including ions, electrons, free radicals, and excited neutrals, move toward the substrate 5 to be etched by diffusion and by bulk flow due to the gas flow generated by the gas manifold system G1, G2, and G3. A bias energy input arrangement 410, comprising a source 420 and a bias matching network 430, couples RF energy to the substrate support electrode 320 for selectively increasing the plasma sheath voltage at the substrate, and thus selectively increasing the ion energy at the substrate.

In the illustrated embodiment, the chamber 110 further incorporates a unique, three-electrode arrangement which can be used to provide a fluorine scavenger, if desired. The substrate support electrode 320 comprises a cathode, the chamber side walls 120 comprises the anode, and a third electrode comprises a sacrificial electrode 17S located beneath the dome topwall 170T. This third electrode may be floating, but is preferably either grounded or connected to an RF power supply 400 and is preferably made of silicon or a silicon-containing alloy, or carbon such as graphite. Excess fluorine ions then interact with this third electrode to form $SiF_x$ or $CF_x$, as the case may be, thereby reducing the total number of fluorine ions in the plasma.

The following examples will serve to illustrate processes in accordance with the invention:

EXAMPLE 1

Figure 1:
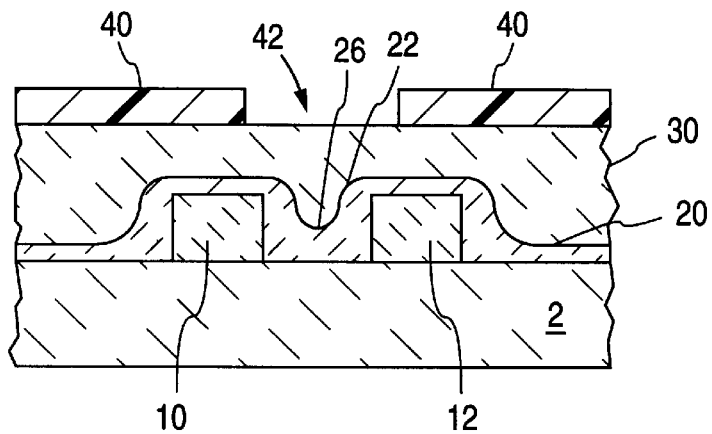
FIG. 1 is a partial cross-sectional view illustrating a typical structure to be etched by a process in accordance with the present invention, having uneven topography with oxide portions to be etched and nitride portions which are generally perpendicular to the underlying substrate.

A 200 millimeter-diameter substrate comprising a silicon wafer having a photoresist mask and a layer of silicon oxide beneath the mask of about 5000–10,000 Angstroms thick over a silicon nitride layer deposited by LPCVD or a plasma enhanced process, and which, in turn was formed over steps on the silicon wafer, forming a structure similar to the one shown in FIG. 1, was etched in an RF etch chamber as described above with respect to FIG. 2, and commercially available from Applied Materials, Inc. as a Centura™ HDP Dielectric Etch System. No third electrode, i.e. no silicon or other fluorine scavenger was maintained in the etch chamber. 20 sccm of $C_2F_6$ was flowed into the chamber as the fluorine-substituted hydrocarbon etching gas, together with 30–35 sccm of $C_2H_2$. Argon source gas flowed at 100 sccm. The pressure in the etch chamber was maintained at about 5–10 milliTorr during the etch and the temperature of the substrate was maintained at about 80°–100° C. The plasma generator power level was maintained at about 1500–2500 watts. A.D.C. bias voltage was maintained on the substrate during the etch by adjusting the RF bias power to 1400 watts. The roof and wall temperatures of the etch chamber were maintained at 175° C. and 215° C., respectively. Helium pressure was 8–15 Torr; chiller temperature was −10° C. The etch was carried out through the opening in the mask, thereby exposing the nitride layer beneath the etched opening in the oxide layer through the resist mask. In the case of each parameter identified above, the preferred value is the midpoint of the disclosed range.

The respective oxide and nitride layers, including the portions of the nitride layer on the sidewalls of the steps, were examined by SEM and the ratio of etched oxide to etched nitride, i.e., the selectivity of the etch process of the invention to nitride on the flat regions was found to be about 75:1, while the selectivity on the sidewalls of the steps was found to be greater than 30:1.

EXAMPLE 2

A 200 millimeter-diameter substrate comprising a silicon wafer having a photoresist mask and a layer of silicon oxide beneath the mask of about 5000–10,000 Angstroms thick over a silicon nitride layer deposited by LPCVD or a plasma enhanced process, and which, in turn was formed over steps on the silicon wafer, forming a structure similar to the one shown in FIG. 1, was etched in an RF etch chamber as described above with respect to FIG. 2, and commercially available from Applied Materials, Inc. as a Centura™ HDP Dielectric Etch System. No third electrode, i.e. no silicon or other fluorine scavenger was maintained in the etch chamber. 10 sccm of $C_4F_8$ was flowed into the chamber as the fluorine-substituted hydrocarbon etching gas, together with 15 sccm of $C_2H_2$. Argon source gas flowed at 100 sccm. The pressure in the etch chamber was maintained at about 5–10 milliTorr during the etch and the temperature of the substrate was maintained at about 80°–100° C. The plasma generator power level was maintained at about 1200 watts. A D.C. bias voltage was maintained on the substrate during the etch by adjusting the RF bias power to 1400 watts. The roof and wall temperatures of the etch chamber were maintained at 220° C. and 200° C., respectively. Helium pressure was 10–12 Torr; chiller temperature was −10° C. The etch was carried out through the opening in the mask, thereby exposing the nitride layer beneath the etched opening in the oxide layer through the resist mask. In the case of each parameter identified above, the preferred value is the midpoint of the disclosed range.

The respective oxide and nitride layers, including the portions of the nitride layer on the sidewalls of the steps, were examined by SEM and the ratio of etched oxide to etched nitride, i.e., the selectivity of the etch process of the invention to nitride on the flat regions was found to be greater than 50:1, while the selectivity on the sidewalls of the steps was found to be greater than 15:1.

Thus, the process of the invention provides for the plasma etching of an oxide layer, in the presence of nitride, with a high selectivity to nitride which is independent of the position of the nitride layer with respect to the plane of the underlying substrate, by the use of acetylene with a fluorine-substituted hydrocarbon etching gas.

It should be understood that various alternatives to the embodiments of the invention described herein may be utilized in practicing the invention. It is intended that the following claims define the scope of the invention and that methods within the scope of these claims and their equivalents be covered thereby.

What is claimed is:

1. A method of plasma etching silicon oxide in the presence of silicon nitride capable of exhibiting high selectivity to silicon nitride, including silicon nitride on uneven surfaces, the method comprising: contacting the silicon oxide with a mixture of gases including a) one or more fluorine-substituted hydrocarbon etching gases; and b) acetylene.

2. The method of claim 1, and wherein the fluorine-substituted hydrocarbon etching gas is $C_4F_8$.

3. The method of claim 1, wherein the fluorine-substituted hydrocarbon etching gas is $C_2F_6$.

4. The method of claim 1, and wherein the mixture of gases includes an inert gas.

5. The method of claim 4, and wherein the inert gas is argon.

6. A method of plasma etching silicon oxide in the presence of silicon nitride, the method having high selectivity to silicon nitride and comprising: contacting the silicon oxide with a mixture of gases including:

a) one or more fluorine-substituted hydrocarbon etching gases selected from $C_4F_8$ and $C_2F_6$; and b) $C_2H_2$, and wherein the amount of $C_2H_2$ mixed with the etching gas is 20–70 volume percent of the etching gas.

7. The method of claim 6, and wherein the amount of $C_2H_2$ mixed with the etching gas is 30–60 volume percent of the etching gas.

8. The method of 6, wherein the mixture of gases includes an inert gas.

9. The method of claim 7, and wherein the inert gas is argon.

* * * * *